(12) United States Patent
Kim et al.

(10) Patent No.: US 9,231,372 B2
(45) Date of Patent: Jan. 5, 2016

(54) SEMICONDUCTOR LASER AND METHOD OF FABRICATING THE SAME

(71) Applicant: Electronics and Telecommunications Research Institute, Daejeon (KR)

(72) Inventors: In Gyoo Kim, Daejeon (KR); Sang Hoon Kim, Daejeon (KR); Jaegyu Park, Daejeon (KR); Gyungock Kim, Daejeon (KR); Ki Seok Jang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/279,839

(22) Filed: May 16, 2014

(65) Prior Publication Data

US 2015/0146755 A1    May 28, 2015

(30) Foreign Application Priority Data

Nov. 28, 2013  (KR) .................. 10-2013-0146375

(51) Int. Cl.
*H01S 5/00* (2006.01)
*H01S 5/10* (2006.01)
*H01S 5/20* (2006.01)

(52) U.S. Cl.
CPC ............. *H01S 5/1021* (2013.01); *H01S 5/2086* (2013.01); *H01S 2304/00* (2013.01)

(58) Field of Classification Search
USPC ........... 372/39, 43.01, 44.01, 44.011, 46.012; 438/69

See application file for complete search history.

(56) References Cited

U.S. PATENT DOCUMENTS

| 6,108,478 | A | 8/2000 | Harpin et al. |
| 6,316,281 | B1 | 11/2001 | Lee et al. |
| 7,088,890 | B2 | 8/2006 | Liu |
| 2009/0023237 | A1 | 1/2009 | Mizumoto et al. |
| 2014/0105235 | A1* | 4/2014 | Kim et al. .................. 372/44.01 |

FOREIGN PATENT DOCUMENTS

| KR | 10-2008-0100210 A | 11/2008 |
| KR | 10-2013-0069116 A | 6/2013 |

OTHER PUBLICATIONS

Zhifeng Yang et al., "Fabrication and characterization of integrated three-dimensional linear taper on silicon-on-insulator", OE Letters, Mar. 2009, pp. 030503-1-030503-3, vol. 48, No. 3.
Rodolfo E. Camacho-Aguilera et al., "An electrically pumped germanium laser", Optics Express, May 7, 2012, pp. 11316-11320, vol. 20, No. 10.

* cited by examiner

*Primary Examiner* — Dung Nguyen (57) ABSTRACT

Provided is a method of fabricating a semiconductor laser. The method includes: providing a semiconductor substrate including a first region and a second region; forming a silicon single crystal layer in the second region of the semiconductor substrate by using a selective epitaxial growth process; forming an optical coupler by using the silicon single crystal layer; and forming a laser core structure including a germanium single crystal layer in the first region of the semiconductor substrate by using a selective epitaxial growth process.

7 Claims, 12 Drawing Sheets

SEMICONDUCTOR LASER AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2013-0146375, filed on Nov. 28, 2013, the entire contents of which are hereby incorporated by reference.

BACKGROUND OF THE INVENTION

The present invention disclosed herein relates to a semiconductor laser and a method of fabricating the same, and more particularly, to a monolithic integrated semiconductor laser with optical devices and a method of fabricating the same.

As the developments of a complementary metal oxide semiconductor (CMOS) device face data transmission speed limitation and power consumption limitation, techniques for implementing optical-interconnection on a silicon wafer receive attentions greater. Optical transmitters, optical receiver, and optical passive devices reach a partial application state through a lot of research and development. Recently, as a germanium light source on a silicon substrate is demonstrated, it is expected the research on monolithic integration of a light source on silicon photonic platform to be accelerated.

SUMMARY OF THE INVENTION

The present invention provides a semiconductor laser for simplified fabricating processes and a method of fabricating the same.

The present invention also provides a monolithic integrated semiconductor laser with optical devices and a method of fabricating the same.

Embodiments of the present invention provide methods of fabricating a semiconductor laser, the method including: providing a semiconductor substrate including a first region and a second region; forming a silicon single crystal layer in the second region of the semiconductor substrate by using a selective epitaxial growth process; forming an optical coupler by using the silicon single crystal layer; and forming a laser core structure including a germanium single crystal layer in the first region of the semiconductor substrate by using a selective epitaxial growth process.

In some embodiments, the semiconductor substrate may include a silicon substrate, an upper silicon layer on the silicon substrate, and a buried oxide layer between the silicon substrate and the upper silicon layer, wherein the silicon single crystal layer may be formed by using the upper silicon layer as a seed.

In other embodiments, the forming of the silicon single crystal layer may include: forming a first mask pattern having a first opening that defines a region where the optical coupler is to be formed and exposes a portion of a top surface of the upper silicon layer, on the upper silicon layer; and removing the first mask pattern after forming the silicon single crystal layer in the first opening.

In still other embodiments, the forming of the optical coupler by using the silicon single crystal layer may include: forming an upper optical coupler by dry etching the silicon single crystal layer; and forming a lower optical coupler by dry etching the upper silicon layer of the second region, wherein the upper optical coupler and the lower optical coupler may be formed to overlap each other, in a plan view.

In even other embodiments, the methods may further include forming an optical waveguide by dry etching the upper silicon layer of the second region, wherein the lower optical coupler and the optical waveguide may be formed simultaneously.

In yet other embodiments, wherein one end of the upper optical coupler and one end of the lower optical coupler may be formed in a tapered shape in a plan view and the one end of the lower optical coupler may be connected to the optical waveguide.

In further embodiments, the forming of the optical coupler by using the silicon single crystal layer may include: forming an upper optical coupler by wet etching the silicon single crystal layer; and forming a lower optical coupler by dry etching the upper silicon layer of the second region, wherein the upper optical coupler and the lower optical coupler may be formed to overlap each other in a plan view.

In still further embodiments, the methods may further include forming an optical waveguide by dry etching the upper silicon layer of the second region, wherein the lower optical coupler and the optical waveguide may be formed simultaneously.

In even further embodiments, one end of the upper optical coupler and one end of the lower optical coupler may be formed in a tapered shape in a plan view, and the one end of the lower optical coupler may be connected to the optical waveguide.

In yet further embodiments, the one end of the upper optical coupler may be formed in a tapered shape from the vertical viewpoint.

In other embodiments of the present invention, semiconductor lasers include: a substrate structure including a first region and a second region; a laser device disposed on the first region of the substrate structure and including germanium of a single crystal structure; an optical coupler disposed on the second region of the substrate structure and including silicon of a single crystal structure; and an optical waveguide disposed on the second region of the substrate structure and spaced from the laser device with the optical coupler therebetween, wherein one end of the optical coupler adjacent to the optical waveguide has a tapered shape toward the optical waveguide and is connected to the optical waveguide.

In some embodiments, the laser device may include: an upper silicon layer on the substrate structure; a protective layer on the upper silicon layer; and a laser core structure between the upper silicon layer and the protective layer, wherein the laser core structure may include germanium of the single crystal structure.

In other embodiments, the optical coupler may include a lower optical coupler and an upper optical coupler that are sequentially stacked, wherein the upper optical coupler may include silicon of the single crystal structure and the lower optical coupler may include the same material as the optical waveguide and a top surface of the lower optical coupler may be coplanar with a top surface of the optical waveguide.

In still other embodiments, one end of the lower optical coupler and one end of the upper optical coupler, each adjacent to the optical waveguide, may have a tapered shape toward the optical waveguide in a plan view and the one end of the lower optical coupler may be connected to the optical waveguide.

In even other embodiments, the one end of the upper optical coupler may have a tapered shape toward the optical waveguide from the vertical viewpoint.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 2A to 7A are plan views illustrating a method of fabricating a semiconductor laser according to an embodiment of the present invention;

FIGS. 2B to 7B are sectional views taken along lines IT of FIGS. 2A to 7A according to an embodiment of the present invention, respectively;

FIGS. 9A to 11A are plan views illustrating a method of fabricating a semiconductor laser according to another embodiment of the present invention;

FIGS. 9B to 11B are sectional views taken along lines IT of FIGS. 9A to 11A, respectively.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

Figure 1:
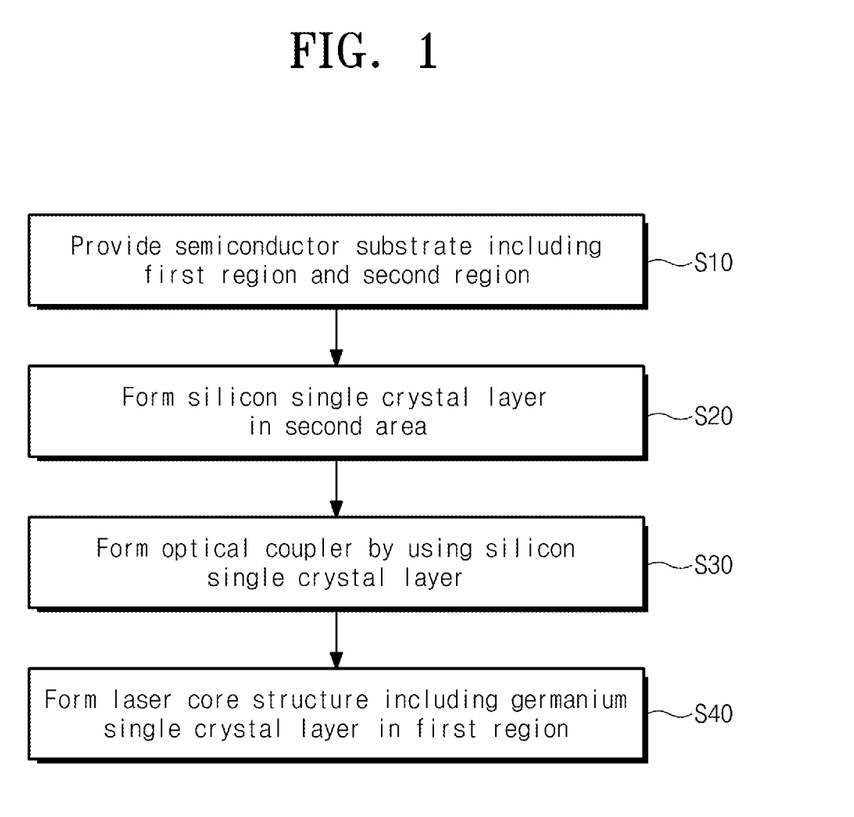
FIG. 1 is a flowchart illustrating a method of fabricating a semiconductor laser according to an embodiment of the present invention.

FIG. 1 is a flowchart illustrating a method of fabricating a semiconductor laser according to an embodiment of the present invention. FIGS. 2A to 7A are plan views illustrating a method of fabricating a semiconductor laser according to an embodiment of the present invention. FIGS. 2B to 7B are sectional views taken along lines I-I' of FIGS. 2A to 7A according to an embodiment of the present invention, respectively.

Figure 2A:
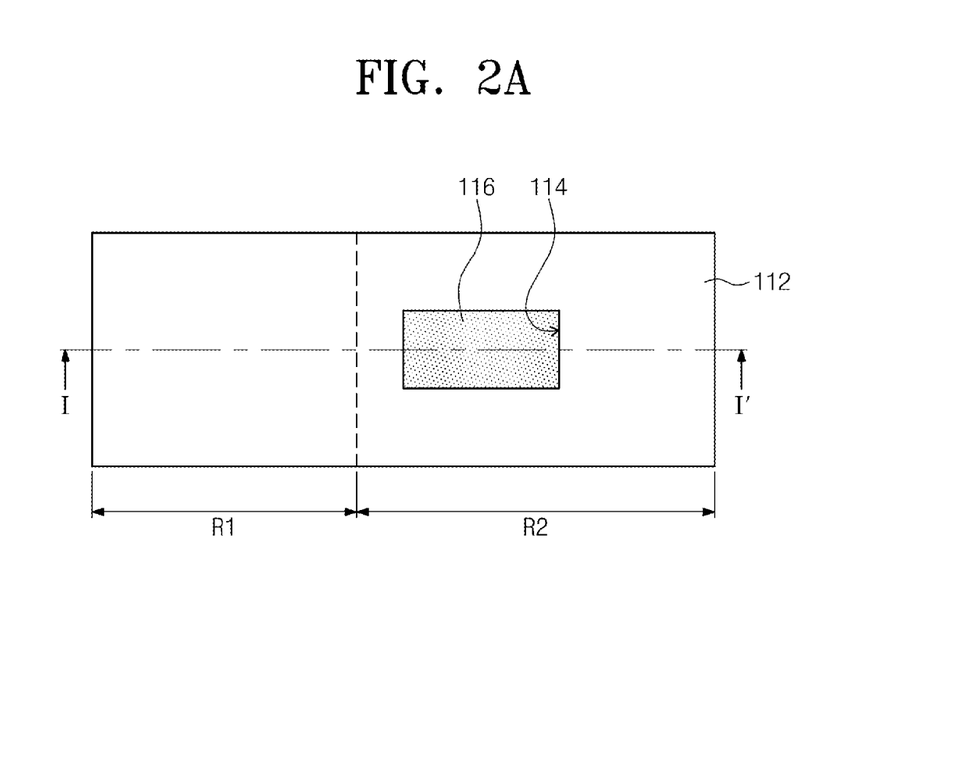
Figure 2B:
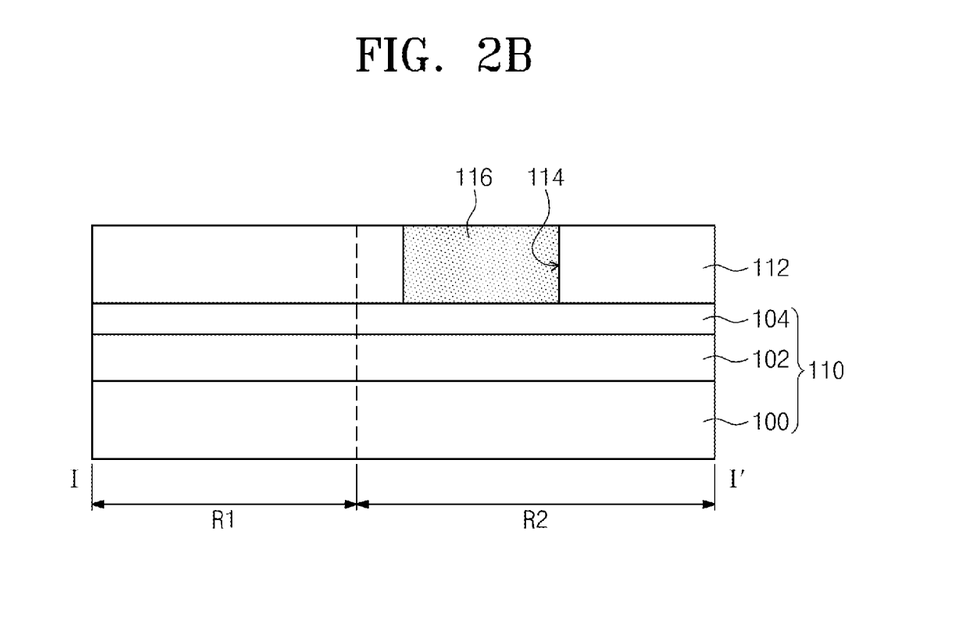

Referring to FIGS. 1, 2A, and 2B, a semiconductor substrate 110 may be provided in operation S10. The semiconductor substrate 110 may include a first region R1 and a second region R2. The first region R1 and the second region R2 are different regions of the semiconductor substrate 110. The first region R1 may be a region where an active device such as a light source is to be formed and the second region R2 may be a region where a passive device such as an optical waveguide is to be formed. The semiconductor substrate 110 includes a silicon substrate 100, an upper silicon layer 104 on the silicon substrate 100 and a buried oxide layer 102 between the silicon substrate 100 and the upper silicon layer 104. For example, the semiconductor substrate 110 may be a silicon-on-insulator (SOI) substrate.

A first mask pattern 112 may be formed on the semiconductor substrate 110. For example, the first mask pattern 112 may include a silicon oxide. The first mask pattern 112 may have a first opening 114 that defines a region where an optical coupler is to be formed in the second region R2. The first opening 114 may expose a portion of the top surface of the upper silicon layer 104.

A silicon single crystal layer 116 may be formed in the first opening 114 in operation S20. The silicon single crystal layer 116 may be formed by performing a selective epitaxial growth process using the upper silicon layer 104 exposed by the first opening 114 as a seed.

Figure 3A:
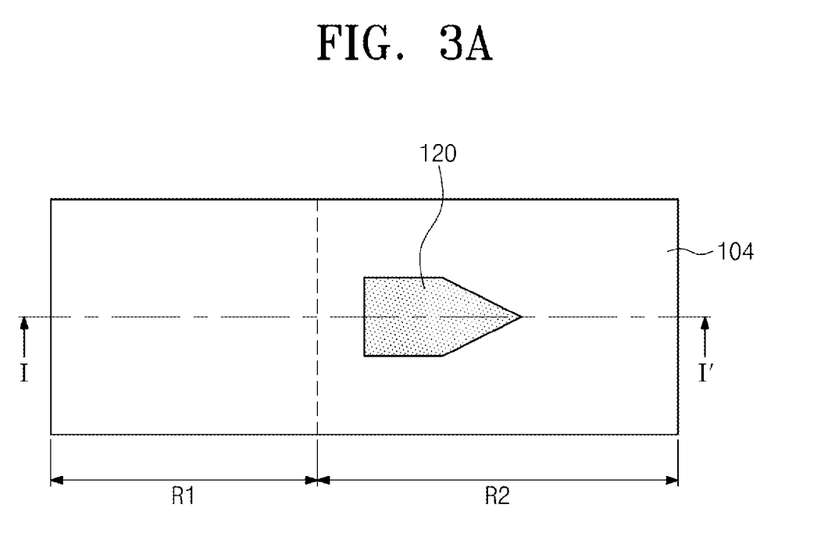
Figure 3B:
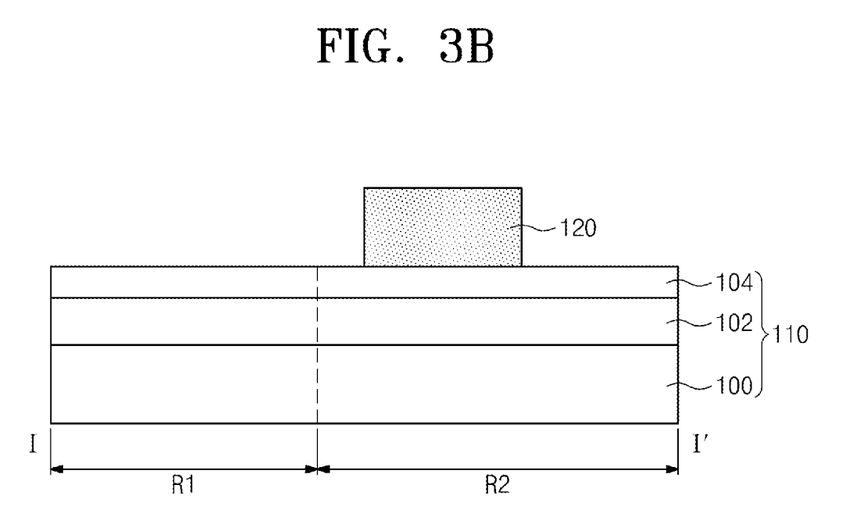

Referring to FIGS. 1, 3A, and 3B, first, after the silicon single crystal layer 116 is formed, the first mask pattern 112 may be removed. Then, an optical coupler may be formed by using the silicon single crystal layer 116 in operation S30.

In more detail, although not shown in the drawing, a first preliminary mask pattern having an opening that exposes a portion of the silicon single crystal layer 116 may be formed on the semiconductor substrate 110. An upper optical coupler 120 may be formed by patterning the silicon single crystal layer 116 by using the first preliminary mask pattern as an etch mask. The patterning of the silicon single crystal layer 116 may be performed by using a dry etch process, for example. After an upper optical coupler 120 is formed, the first preliminary mask pattern may be removed. One end of the upper optical coupler 120 may be formed in a tapered shape in a plan view as shown in FIG. 3A.

Figure 4A:
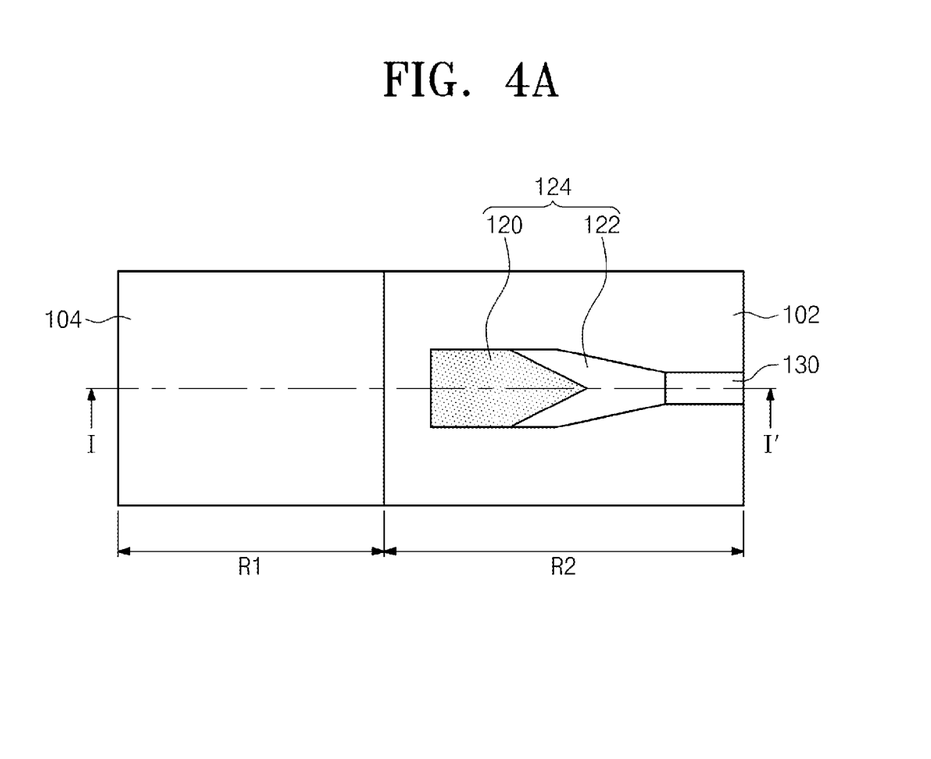
Figure 4B:
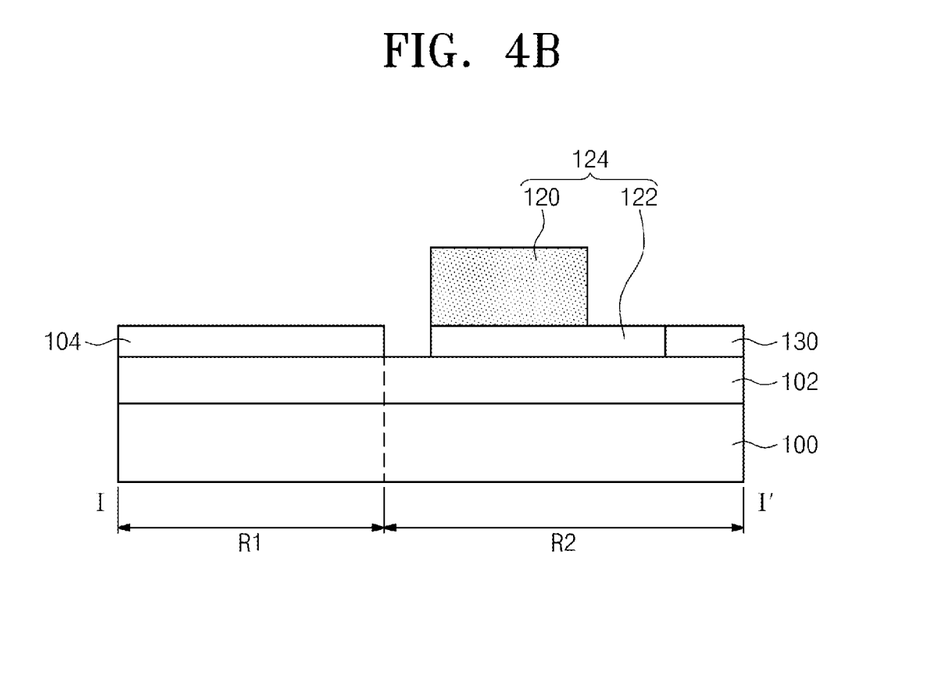

Then, referring to FIGS. 4A and 4B, a lower optical coupler 122 and an optical waveguide 130 may be simultaneously formed by patterning the upper silicon layer 104 of the second region R2. The patterning of the upper silicon layer 104 of the second region R2 may be performed by using a dry etch process, for example. Due to the dry etch process, the buried oxide layer 102 of the second region R2 may be exposed.

The lower optical coupler 122 may be formed to overlap the upper optical coupler 120 in a plan view. That is, a bottom surface of the upper optical coupler 120 may contact a portion of a top surface of the lower optical coupler 122. One end of the lower optical coupler 122 may be formed in a tapered shape in a plan view, as shown in FIG. 4A. The one end of the lower optical coupler 122 may be connected to the optical waveguide 130. That is, the one end of the lower optical coupler 122 may contact one end of the optical waveguide 130. The lower optical coupler 122 may include the same material as the optical waveguide 130. The top surface of the lower optical coupler 122 may be coplanar with a top surface of the optical waveguide 130.

The upper optical coupler 120 and the lower optical coupler 122 may be defined as an optical coupler 124 and the optical coupler 124 may deliver light between a light source to be formed in the first region R1 and the optical waveguide 130.

Figure 5A:
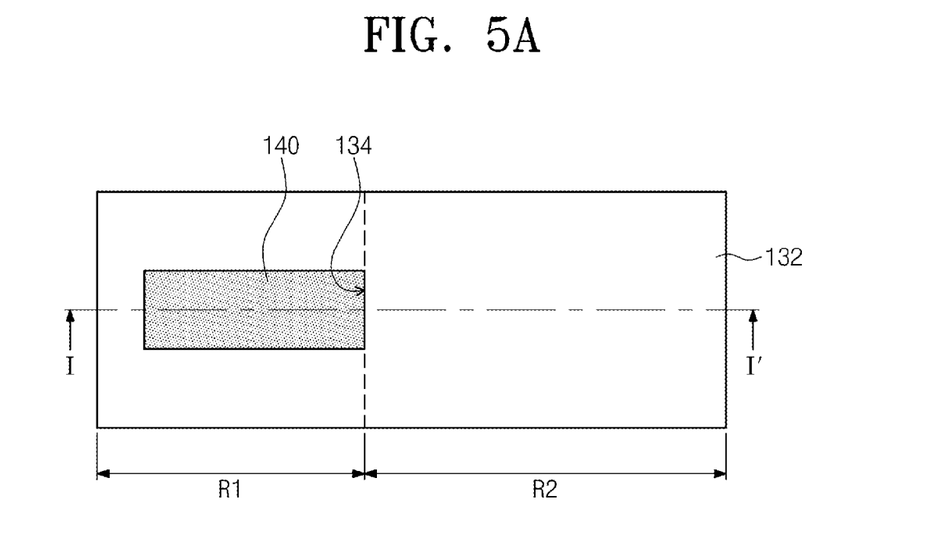
Figure 5B:
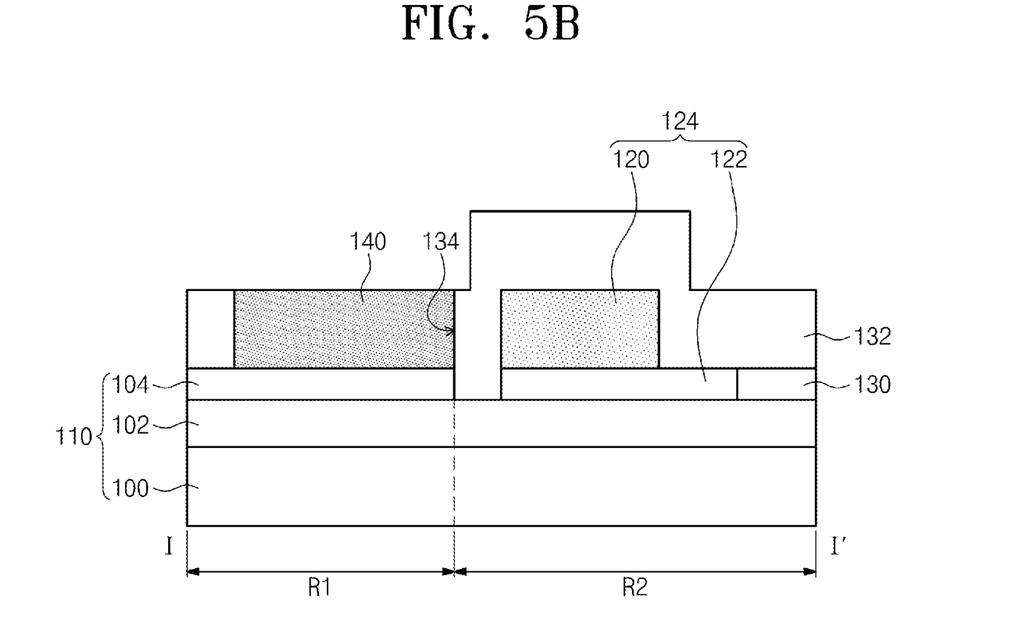

Referring to FIGS. 1, 5A, and 5B, a second mask pattern 132 covering the optical coupler 124 and the optical waveguide 130 may be formed on the semiconductor substrate 100. For example, the second mask pattern 130 may include a silicon oxide. The second mask pattern 130 may include a second opening 134 that defines a region where a laser core structure 140 is to be formed in the first region R1. The second opening 134 may expose a portion of the top surface of the upper silicon layer 104 in the first region R1.

The laser core structure 140 including a germanium single crystal layer may be formed in the second opening 134 in operation S40. The forming of the laser core structure 140 may include forming a germanium single crystal layer by performing a selective epitaxial growth process by using the upper silicon layer 104 exposed by the second opening 134 as a seed.

Figure 6A:
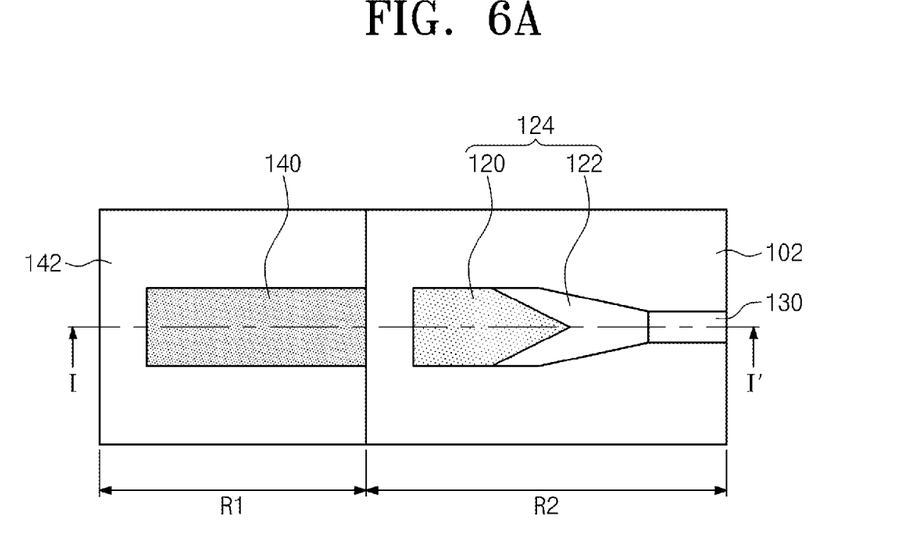
Figure 6B:
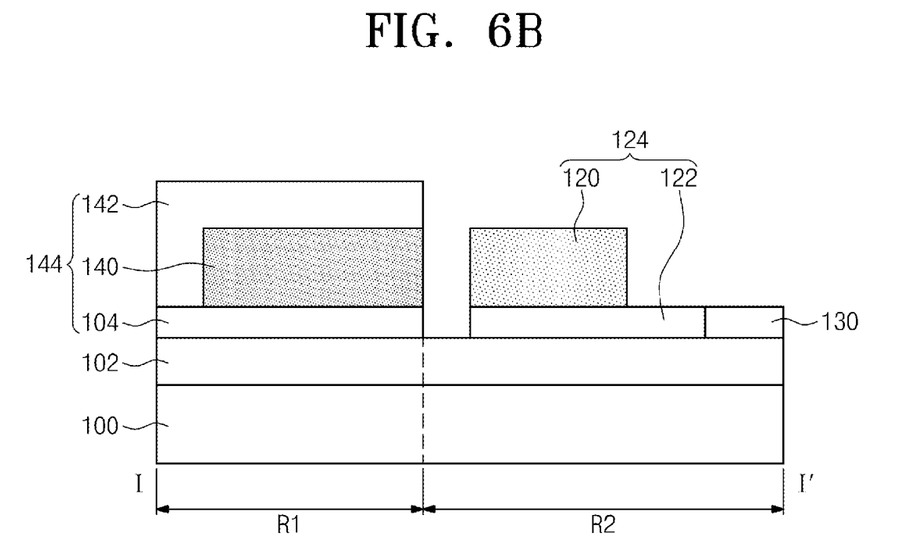

Referring to FIGS. 1, 6A, and 6B, first, after the laser core structure 140 is formed, the second mask pattern 132 may be removed. Then, a protective layer 142 covering the laser core structure 140 may be formed in the first region R1. For example, the protective layer 142 may include a silicon oxide. In this case, the refractive index of the laser core structure 140 may be greater than the refractive index of the upper silicon layer 104 and the refractive index of the protective layer 142. That is, the protective layer 142 may be an upper cladding layer of a laser device and the upper silicon layer 104 may be a lower cladding layer of a laser device. One end of the laser core structure 140 may face one end of the optical coupler 124. That is, the optical coupler 124 may be disposed between the laser core structure 140 and the optical waveguide 130 and the other end of the optical coupler 124 adjacent to the optical waveguide 130 may have a tapered shape in a direction of the optical waveguide 130 in a plan view.

Figure 7A:
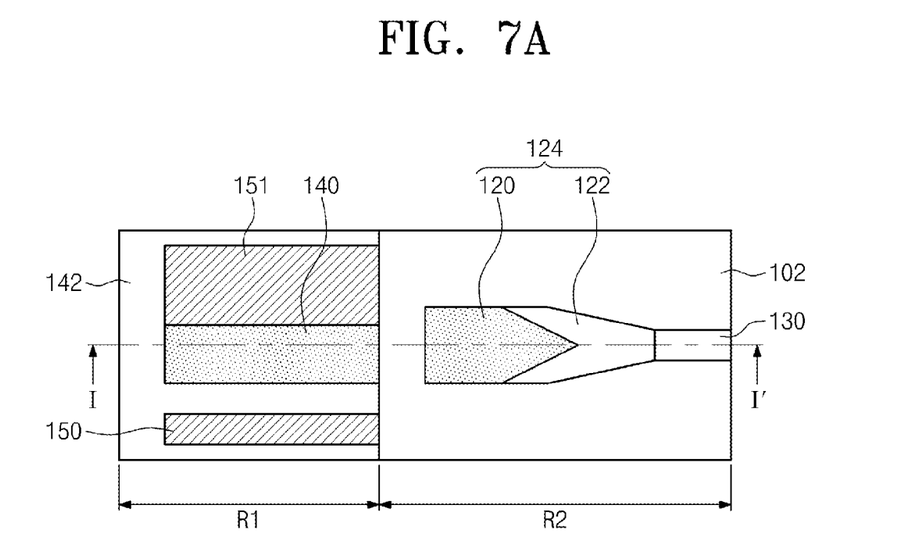
Figure 7B:
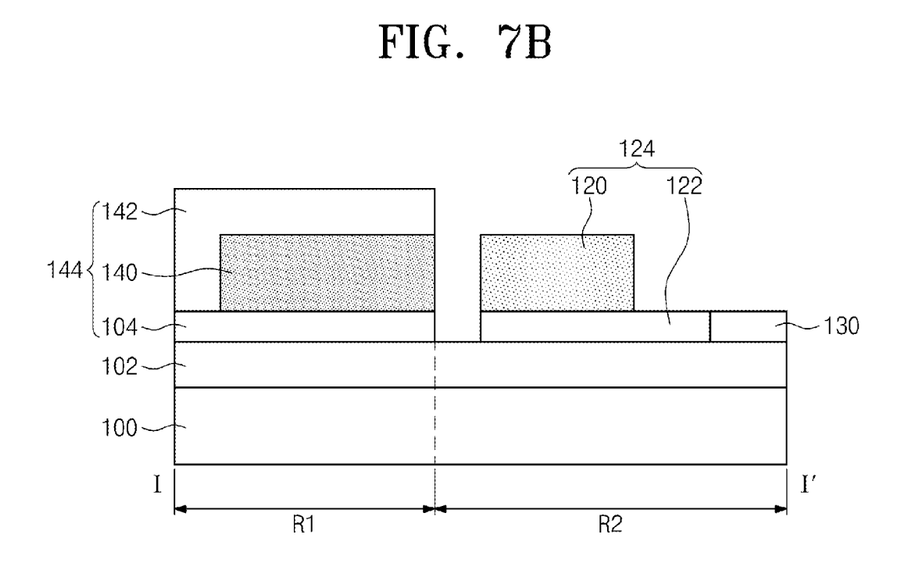

Referring to FIGS. 7A and 7B, a first electrode 150 and a second electrode 151 may be formed on the protective layer 142. The first electrode 150 penetrates the protective layer 142 and thus electrically contacts the upper silicon layer 104 of the first region R1 and the second electrode 151 penetrates the protective layer 142 and thus electrically contacts the laser core structure 140.

Figure 8:
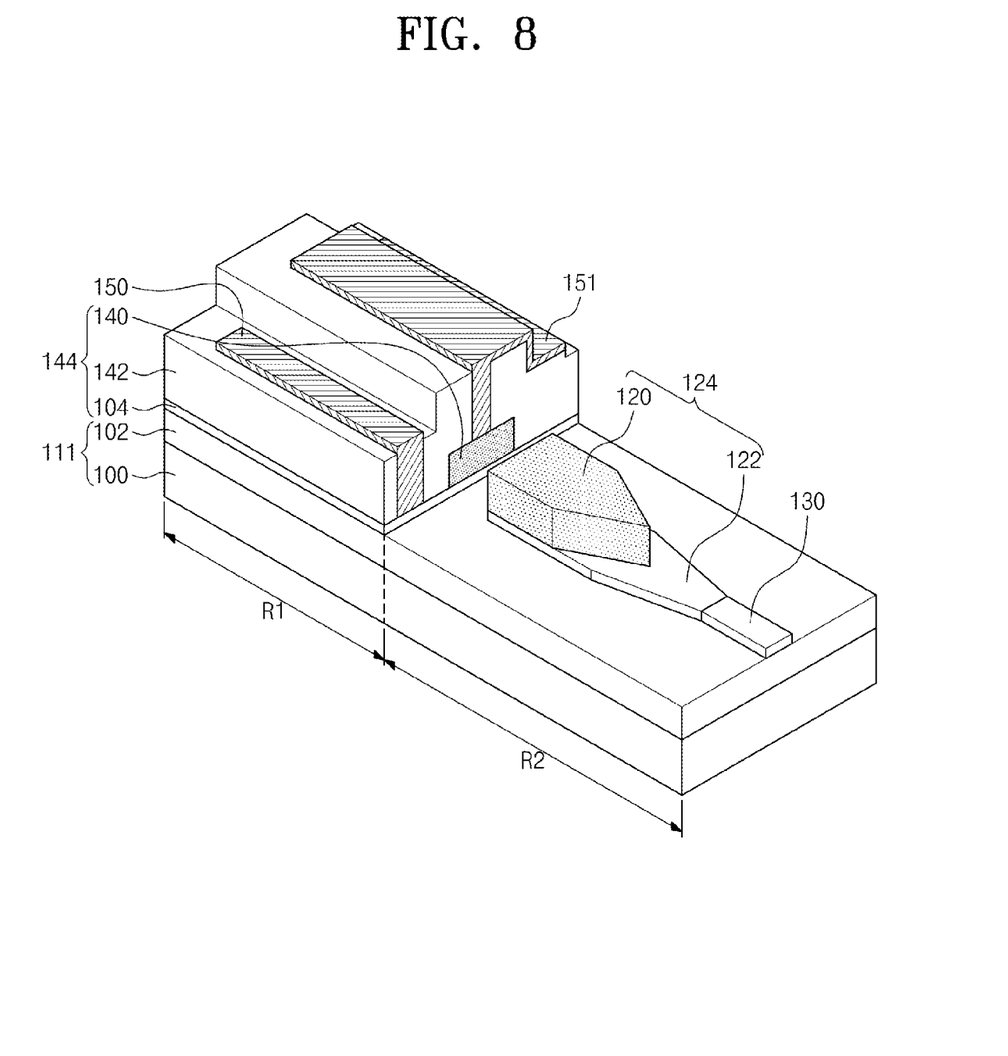
FIG. 8 is a view illustrating a semiconductor laser fabricated according to an embodiment of the present invention.

FIG. 8 is a view illustrating a semiconductor laser fabricated according to an embodiment of the present invention. Referring to FIG. 8, the structural features of the semiconductor laser are described.

Referring to FIG. 8, a substrate structure 111 including a silicon substrate 100 and a buried oxide layer 102 may be provided. The substrate structure 111 may include a first region R1 and a second region R2. The first region R1 and the second region R2 are different regions of the substrate structure 111. The first region R1 may be a region where an active device such as a light source is to be formed and the second region R2 may be a region where a passive device such as an optical waveguide is to be formed.

A laser device 144 may be disposed on the substrate structure 111 of the first region R1. The laser device 144 may include an upper silicon layer 104 on the buried oxide layer 102 of the first region R1, a laser core structure 140 on the upper silicon layer 104, and a protective layer 142 covering the laser core structure 140 on the upper silicon layer 104. The protective layer 142 may cover the top surface and both sidewalls of the laser core structure 140 and may contact a portion of the top surface of the upper silicon layer 104. That is, the bottom surface of the protective layer 142 may contact the top surface of the laser core structure 140, both sidewalls of the laser core structure 140, and the top surface of the upper silicon layer 104. The laser core structure 140 may include germanium of a single crystal structure formed by selective epitaxial growth and the protective layer 142 may include a silicon oxide.

A first electrode 150 penetrating the protective layer 142 and electrically connected to the upper silicon layer 104 may be disposed on the protective layer 142. Furthermore, a second electrode 151 penetrating the protective layer 142 and electrically connected to the laser core structure 140 may be disposed on the protective layer 142.

An optical coupler 124 and an optical waveguide 130 may be disposed on the substrate structure 111 of the second region R2. The optical coupler 124 may be disposed between the laser device 144 and the optical waveguide 130 and accordingly, the light oscillated from the laser device 144 is incident to the optical coupler 124 and guided along the optical waveguide 130 in order for light progression.

The optical coupler 124 may include an upper optical coupler 120 and a lower optical coupler 122. The bottom surface of the upper optical coupler 120 may contact a portion of the top surface of the lower optical coupler 122. One end of the upper optical coupler 120 adjacent to the optical waveguide 130 may have a tapered shape toward the optical waveguide 130 in a plan view. Additionally one end of the lower optical coupler 122 adjacent to the optical waveguide 130 may have a tapered shape toward the optical waveguide 130 in a plan view and may contact one end of the optical waveguide 130. The lower optical coupler 122 may include the same material as the optical waveguide 130 and the top surface of the lower optical coupler 122 may be coplanar with the top surface of the optical waveguide 130. The upper optical coupler 120 may include silicon of a single crystal structure formed by selective epitaxial growth.

According to the concept of the present invention, by forming the laser device 144 and the optical coupler 124 on a SOI substrate by using a selective epitaxial growth process, a semiconductor laser including the laser device 144, the optical coupler 124, and the optical waveguide 130 integrated monolithically on the same substrate may be easily formed. Furthermore, as one end of the optical coupler 124 adjacent to the optical waveguide 130 is formed to have a tapered shape toward the optical waveguide 130, the loss of light due to a size difference between the laser device 144 and the optical waveguide 130 may be reduced.

FIGS. 9A to 11A are plan views illustrating a method of fabricating a semiconductor laser according to another embodiment of the present invention and FIGS. 9B to 11B are sectional views taken along lines I-I' of FIGS. 9A to 11A, respectively. Overlapping contents described with reference to FIGS. 2A to 7A and 2B to 7B are omitted for conciseness and like reference numerals refer to like elements.

First, as described with reference to FIGS. 1, 2A, and 2B, a semiconductor substrate 110 including a first region R1 and a second region R2 may be provided in operation S10. The semiconductor substrate 110 includes a silicon substrate 100, an upper silicon layer 104 on the silicon substrate 100, and a buried oxide layer 102 between the silicon substrate 100 and the upper silicon layer 104. For example, the semiconductor substrate 110 may be an SOI.

A first mask pattern 112 may be formed on the semiconductor substrate 110. The first mask pattern 112 may have a first opening 114 that defines a region where an optical coupler is to be formed in the second region R2. The first opening 114 may expose a portion of the top surface of the upper silicon layer 104.

A silicon single crystal layer 116 may be formed in the first opening 114 in operation S20. The silicon single crystal layer 116 may be formed by performing a selective epitaxial growth process by using the upper silicon layer 104 exposed by the first opening 114 as a seed.

Figure 9A:
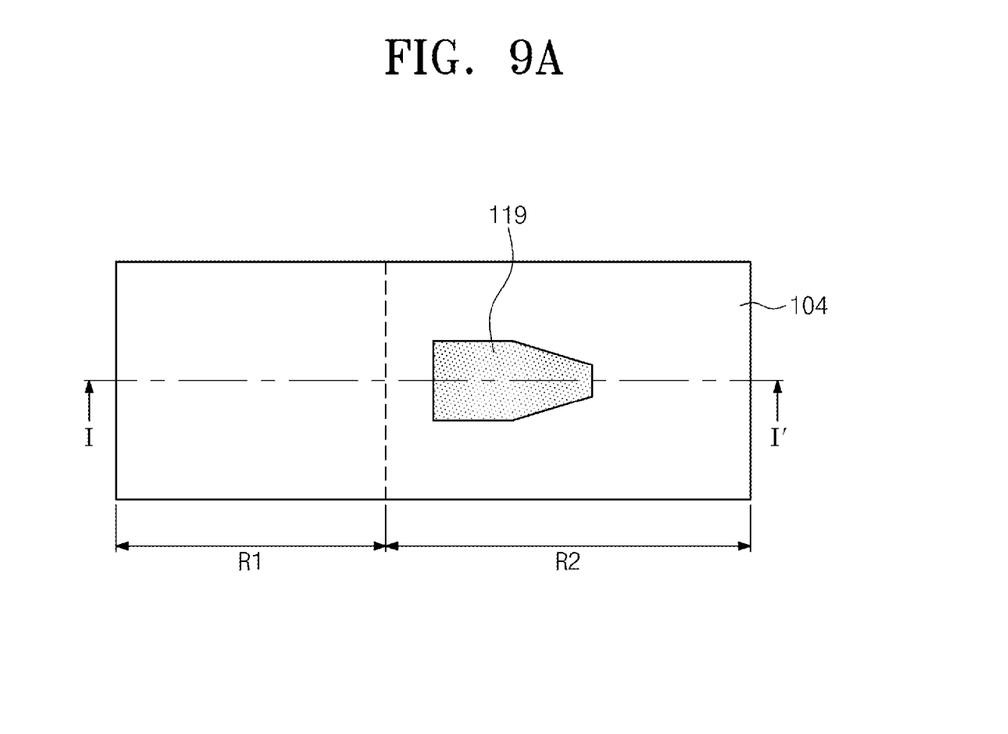
Figure 9B:
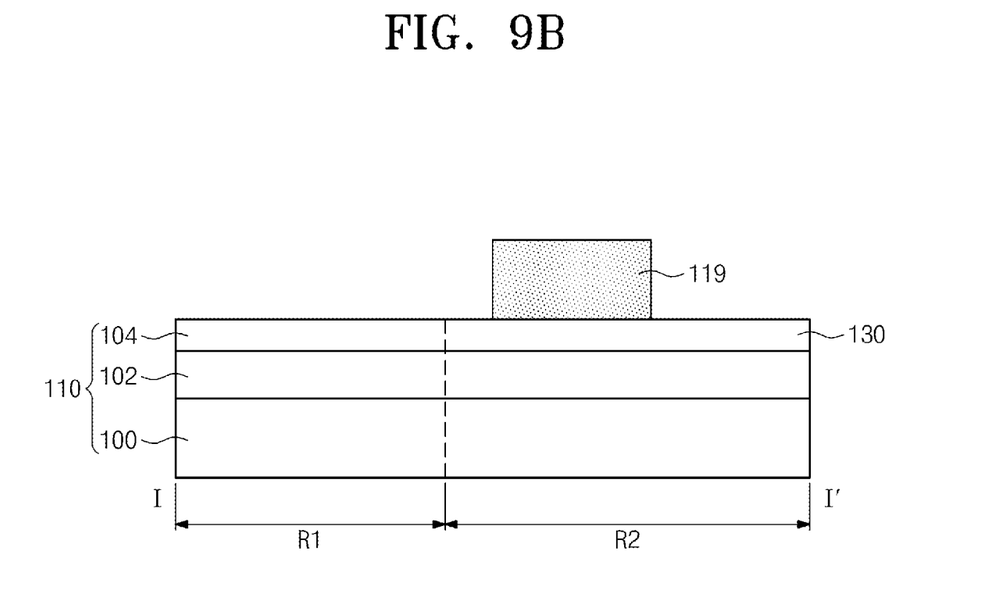

Referring to FIGS. 1, 9A, and 9B, first, the after the silicon single crystal layer 116 is formed, the first mask pattern 112 may be removed. Then, an optical coupler may be formed by using the silicon single crystal layer 116 in operation S30.

In more detail, although not shown in the drawing, a first preliminary mask pattern having an opening that exposes a portion of the silicon single crystal layer 116 may be formed on the semiconductor substrate 110. A preliminary optical coupler 119 may be formed by patterning the silicon single crystal layer 116 by using the first preliminary mask pattern as an etch mask. The patterning of the silicon single crystal layer 116 may be performed by using a dry etch process, for example. One end of the preliminary optical coupler 119 may be formed in a tapered shape in a plan view as shown in FIG. 9A.

Figure 10A:
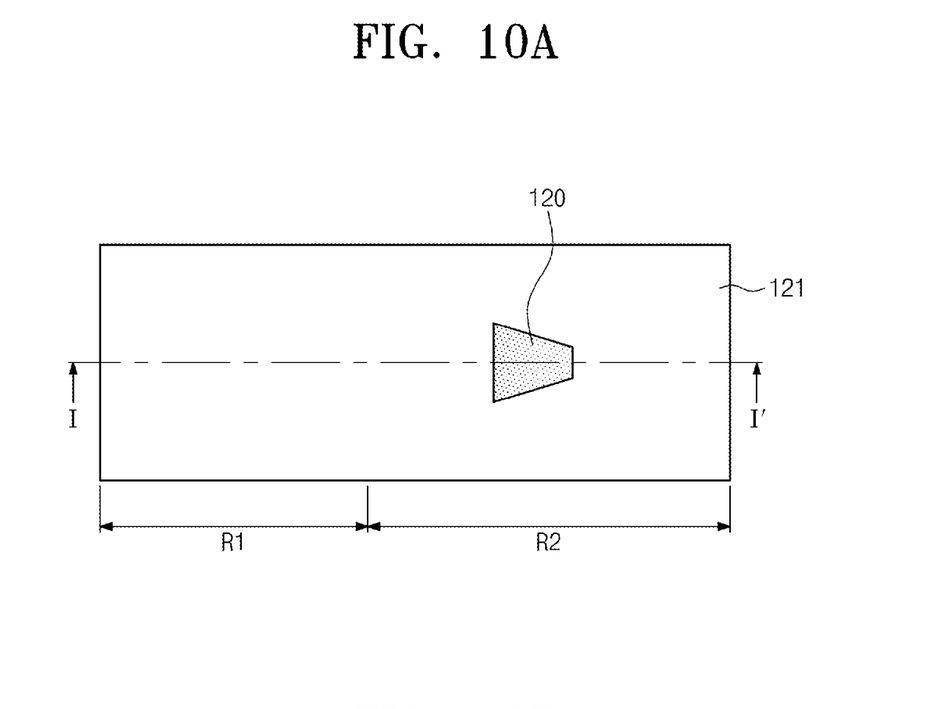
Figure 10B:
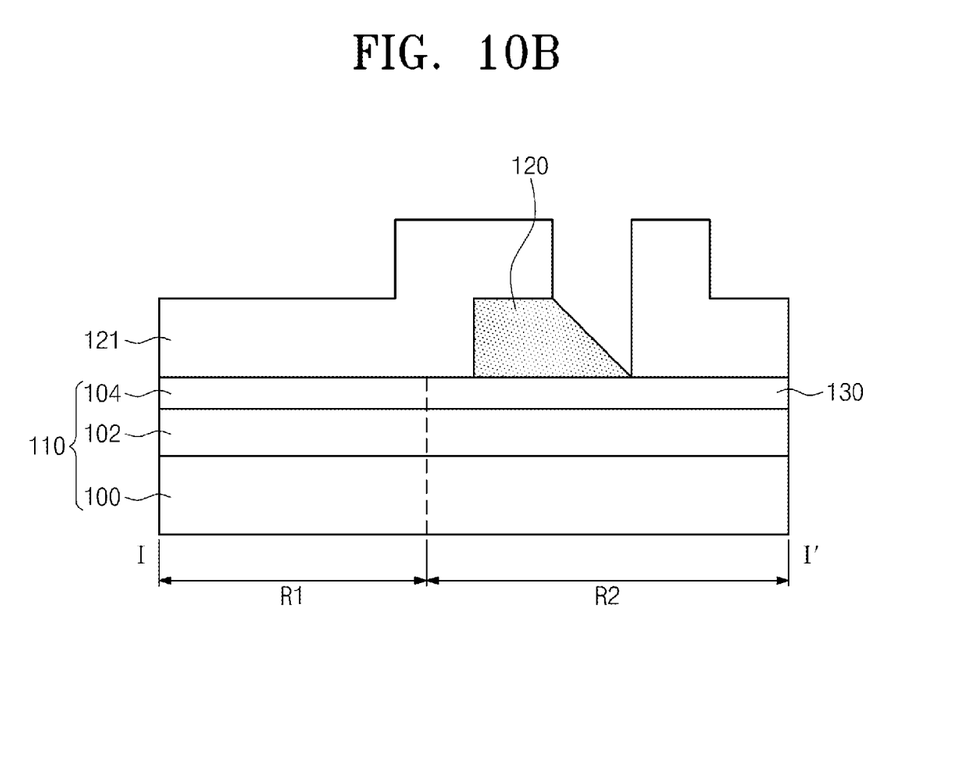

Then, referring to FIGS. 10A and 10B, after the preliminary optical coupler 119 is formed, the first preliminary mask pattern may be removed. Then, a second preliminary mask pattern 121 exposing the one end of the preliminary optical coupler 119 may be formed on the semiconductor substrate 110. An upper optical coupler 120 may be formed by patterning the preliminary optical coupler 119 by using the second preliminary mask pattern 121 as an etch mask. The patterning of the preliminary optical coupler 119 may be performed by a wet etch process, for example. The wet etch process may have different etch rates according to a silicon crystallization direction of the preliminary optical coupler 119. That is, under the etch condition having a faster etch rate along one direction of a silicon crystal structure than any other directions of the silicon crystal structure, the preliminary optical coupler 119 is etched isotropically so that one end of the upper optical coupler 120 may be formed in a tapered shape from a vertical perspective as shown in FIG. 10B. That is, unlike an embodiment of the present invention described with reference to FIGS. 3A and 3B, the one end of the upper optical coupler 120 may be formed in a tapered shape from the vertical viewpoint and also in a plan view.

Figure 11A:
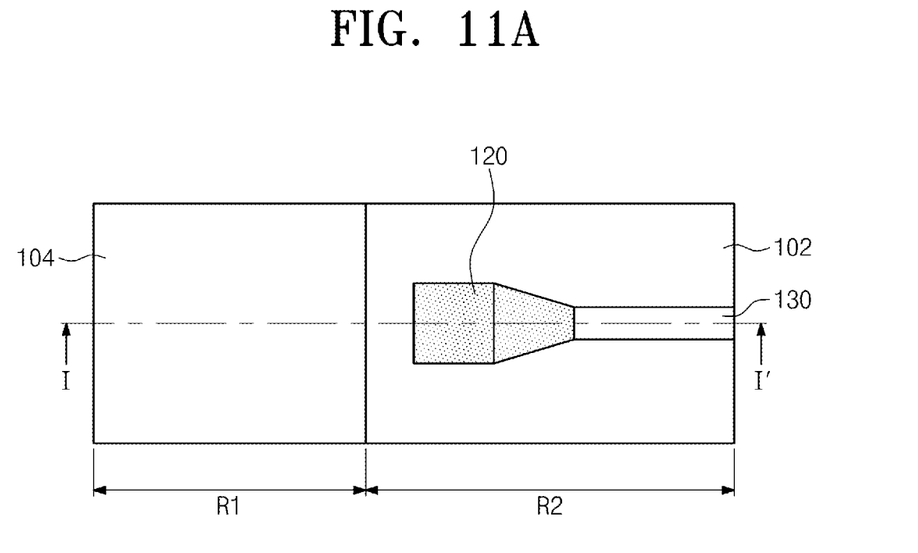
Figure 11B:
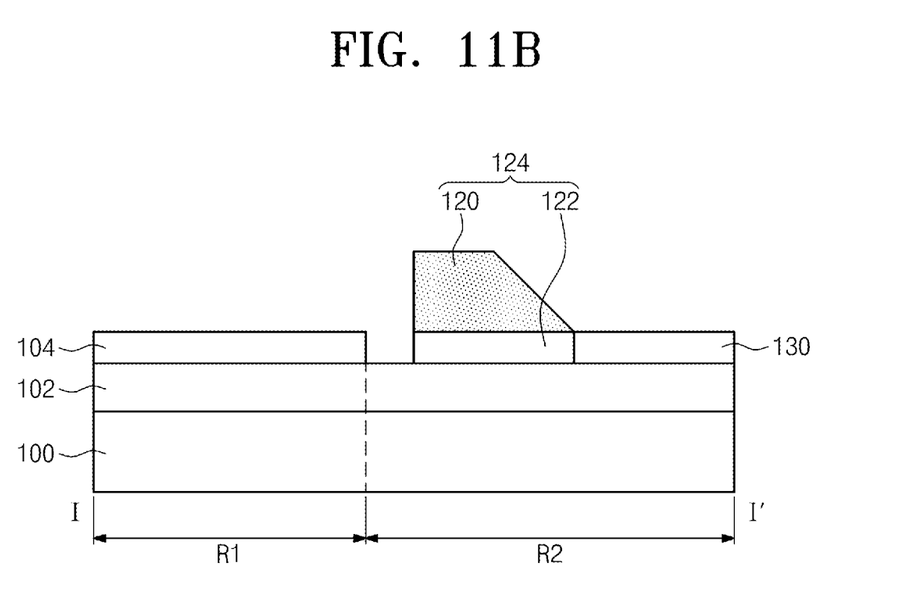

Referring to FIGS. 11A and 11B, first, the second preliminary mask pattern 121 may be removed. Then, a lower optical coupler 122 and an optical waveguide 130 may be simultaneously formed by patterning the upper silicon layer 104 of the second region R2. The patterning of the upper silicon layer 104 of the second region R2 may be performed by using a dry etch process, for example. Due to the dry etch process, the buried oxide layer 102 of the second region R2 may be exposed.

The lower optical coupler 122 may be formed to overlap the upper optical coupler 120 in a plan view. That is, the bottom surface of the upper optical coupler 120 may contact the top surface of the lower optical coupler 122 and the upper optical coupler 122 may have sidewalls aligned to the sidewalls of the upper optical coupler 120. Accordingly, one end of the lower optical coupler 122 may be formed in a tapered shape in a plan view. The lower optical coupler 122 may include the same material as the optical waveguide 130 and the top surface of the lower optical coupler 122 may be coplanar with the top surface of the optical waveguide 130. The one end of the lower optical coupler 122 may be connected to the optical waveguide 130. That is, the one end of the lower optical coupler 122 may contact one end of the optical waveguide 130.

The upper optical coupler 120 and the lower optical coupler 122 may be defined as an optical coupler 124 and the optical coupler 124 may deliver light between a light source to be formed in the first region R1 and the optical waveguide 130.

The subsequent processes are identical to the fabrication processes of the semiconductor laser described with reference to FIGS. 5A to 7A and 5B to 7B.

Figure 12:
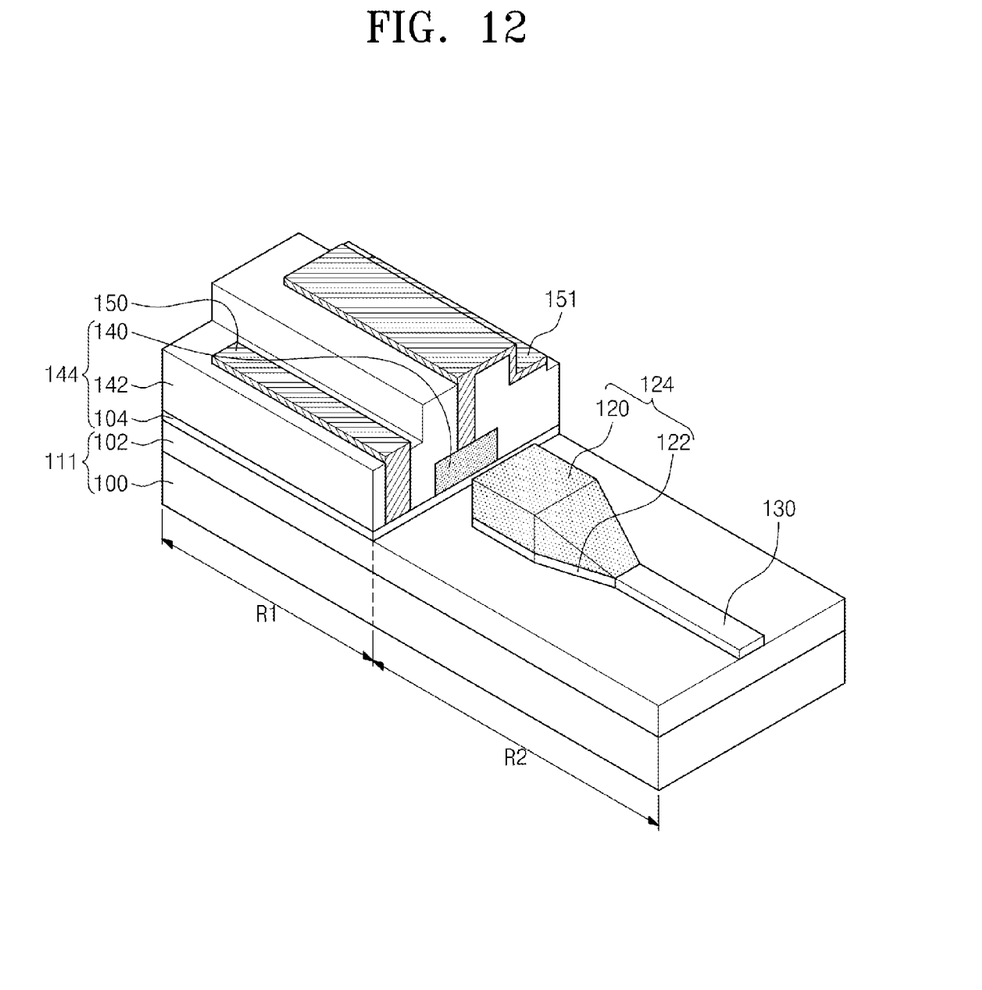
FIG. 12 is a view illustrating a semiconductor laser fabricated according to another embodiment of the present invention.

FIG. 12 is a view illustrating a semiconductor laser fabricated according to another embodiment of the present invention. Referring to FIG. 12, the structural features of a semiconductor laser fabricated according another embodiment of the present invention are described. Overlapping contents described with reference to FIG. 8 are omitted for conciseness and like reference numerals refer to like elements.

Referring to FIG. 12, a substrate structure 111 including a silicon substrate 100 and a buried oxide layer 102 may be provided. The substrate structure 111 may include a first region R1 and a second region R2.

A laser device 144 may be disposed on the substrate structure 111 of the first region R1. The laser device 144 may include an upper silicon layer 104 on the buried oxide layer 102 of the first region R1, a laser core structure 140 on the upper silicon layer 104, and a protective layer 142 covering the laser core structure 140 on the upper silicon layer 104. The bottom surface of the protective layer 142 may contact the top surface of the laser core structure 140, both sidewalls of the laser core structure 140, and the top surface of the upper silicon layer 104. The laser core structure 140 may include germanium of a single crystal structure formed by selective epitaxial growth and the protective layer 142 may include a silicon oxide.

A first electrode 150 penetrating the protective layer 142 and electrically connected to the upper silicon layer 104 may be disposed on the protective layer 142. Furthermore, a second electrode 151 penetrating the protective layer 142 and electrically connected to the laser core structure 140 may be disposed on the protective layer 142.

An optical coupler 124 and an optical waveguide 130 may be disposed on the substrate structure 111 of the second region R2. The optical coupler 124 may be disposed between the laser device 144 and the optical waveguide 130.

The optical coupler 124 may include an upper optical coupler 120 and a lower optical coupler 122. The bottom surface of the upper optical coupler 120 may contact the top surface of the lower optical coupler 122. The lower optical coupler 122 may have sidewalls aligned to the sidewalls of the upper optical coupler 120. One end of the upper optical coupler 120 adjacent to the optical waveguide 130 may have a tapered shape toward the optical waveguide 130 in a plan view. Moreover, the one end of the upper optical coupler 120 may have a tapered shape toward the optical waveguide 130 from the vertical view point. One end of the lower optical coupler 122 adjacent to the optical waveguide 130 may have a tapered shape toward the optical waveguide 130 in a plan view and may contact one end of the optical waveguide 130. The lower optical coupler 122 may include the same material as the optical waveguide 130 and the top surface of the lower optical coupler 122 may be coplanar with the top surface of the optical waveguide 130. The upper optical coupler 120 may include silicon of a single crystal structure formed by selective epitaxial growth.

According to the concept of the present invention, by forming the laser device 144 and the optical coupler 124 on a SOI substrate through a selective epitaxial growth process, a semiconductor laser including the laser device 144, the optical coupler 124, and the optical waveguide 130 integrated monolithically on the same substrate may be easily formed.

According to embodiments of the present invention, a monolithic integrated semiconductor laser with optical devices fabricated on a silicon-on-insulator (SOI) substrate through photonics technique is easily fabricated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor laser, the method comprising:
   providing a semiconductor substrate including a first region and a second region;
   forming a silicon single crystal layer in the second region of the semiconductor substrate by using a selective epitaxial growth process;
   forming an optical coupler by using the silicon single crystal layer; and
   forming a laser core structure including a germanium single crystal layer in the first region of the semiconductor substrate by using a selective epitaxial growth process,
   wherein the semiconductor substrate comprises a silicon substrate, an upper silicon layer on the silicon substrate, and a buried oxide layer between the silicon substrate and the upper silicon layer,
   wherein forming the optical coupler by using the silicon single crystal layer comprises:
      forming an upper optical coupler by dry etching the silicon single crystal layer; and
      forming a lower optical coupler by dry etching the upper silicon layer of the second region, and
   wherein the upper optical coupler and the lower optical coupler are formed to overlap each other in a plan view.

2. The method of claim 1, further comprising forming an optical waveguide by dry etching the upper silicon layer of the second region,
   wherein the lower optical coupler and the optical waveguide are formed simultaneously.

3. The method of claim 2, wherein one end of the upper optical coupler and one end of the lower optical coupler are formed in a tapered shape in a plan view and the one end of the lower optical coupler is connected to the optical waveguide.

4. A method of fabricating a semiconductor laser, the method comprising:
   providing a semiconductor substrate including a first region and a second region;
   forming a silicon single crystal layer in the second region of the semiconductor substrate by using a selective epitaxial growth process;
   forming an optical coupler by using the silicon single crystal layer; and
   forming a laser core structure including a germanium single crystal layer in the first region of the semiconductor substrate by using a selective epitaxial growth process,
   wherein the semiconductor substrate comprises a silicon substrate, an upper silicon layer on the silicon substrate, and a buried oxide layer between the silicon substrate and the upper silicon layer,
   wherein forming the optical coupler by using the silicon single crystal layer comprises:
      forming an upper optical coupler by wet etching the silicon single crystal layer; and
      forming a lower optical coupler by dry etching the upper silicon layer of the second region, and
   wherein the upper optical coupler and the lower optical coupler are formed to overlap each other in a plan view.

5. The method of claim 4, further comprising forming an optical waveguide by dry etching the upper silicon layer of the second region,
   wherein the lower optical coupler and the optical waveguide are formed simultaneously.

6. The method of claim 5, wherein one end of the upper optical coupler and one end of the lower optical coupler are formed in a tapered shape in a plan view, and the one end of the lower optical coupler is connected to the optical waveguide.

7. The method of claim 6, wherein the one end of the upper optical coupler is formed in a tapered shape from the vertical viewpoint.

* * * * *